United States Patent
Diana et al.

(10) Patent No.: US 11,967,588 B2
(45) Date of Patent: Apr. 23, 2024

(54) OPTICAL ENCLOSURES FOR LED MODULES

(71) Applicant: Lumileds LLC, San Jose, CA (US)

(72) Inventors: Frederic Stephane Diana, Santa Clara, CA (US); Charles André Schrama, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 224 days.

(21) Appl. No.: 17/122,992

(22) Filed: Dec. 15, 2020

(65) Prior Publication Data
US 2022/0189938 A1   Jun. 16, 2022

(51) Int. Cl.
*H01L 25/16*   (2023.01)
*H01L 33/58*   (2010.01)

(52) U.S. Cl.
CPC .......... *H01L 25/165* (2013.01); *H01L 25/167* (2013.01); *H01L 33/58* (2013.01); *H01L 2933/0058* (2013.01)

(58) Field of Classification Search
CPC ..... H01L 25/165; H01L 25/167; H01L 33/58; H01L 2933/0058
See application file for complete search history.

(56) References Cited

U.S. PATENT DOCUMENTS

| | | | | |
|---|---|---|---|---|
| 2010/0233427 | A1* | 9/2010 | De Giuseppe | B32B 3/28 428/119 |
| 2015/0042897 | A1* | 2/2015 | Namekata | G02F 1/133603 349/67 |
| 2021/0054984 | A1* | 2/2021 | Shin | F21V 5/007 |

* cited by examiner

*Primary Examiner* — Jay C Chang
*Assistant Examiner* — Mikka Liu
(74) *Attorney, Agent, or Firm* — Schwegman, Lundberg & Woessner, P.A.

(57) ABSTRACT

Various embodiments include combined lens and safety enclosure apparatuses and methods for forming the apparatuses. In one example a combined lens and safety enclosure apparatus for a light-emitting diode (LED) module is disclosed. The enclosure apparatus includes at least one plastic-material-based optical-lens element mounted over a plurality of LED elements, where a distance between the optical-lens element and any portion of any one of the plurality of LED elements is spaced away from each other by at least 0.8 mm. A driver-on-board (DoB) subsystem, including an electronic circuit configured to provide power to the plurality of LED elements, has a plastic-material-based optical enclosure mounted over the DoB subsystem. A distance between the optical enclosure and any portion of any of the electronic circuit is spaced away from optical enclosure by at least 0.8 mm. Other devices and methods are described.

11 Claims, 2 Drawing Sheets

OPTICAL ENCLOSURES FOR LED MODULES

TECHNICAL FIELD

The subject matter disclosed herein relates to a light-emitting diode (LED) module that is packaged with a combined lens and safety enclosure to reduce an overall system-cost. The safety enclosure can cover both one or more LED elements and a driver on board (DoB) electronics subsystem (DoB subsystem). In some embodiments, the enclosure can include or be attached to reinforcing mechanical pillars or sidewalls.

BACKGROUND

Lighting applications often use light-emitting diodes (LEDs) as their light sources. As noted above, many LED installations use Class 2 circuitry. Class 2 circuitry provides protection from electrical shock and carries little to no risk from fire. For example, in the United States, Class 2-compliant power supplies convert a 120 VAC (e.g., wall power or mains power) supply into low voltage 12 V or 24 V using DC drivers that use less than 60 V (60 V in dry applications, 30 V in wet applications), less than 5 amps, and under 100 W. These considerations may pose restrictions on the number of LEDs a Class 2 driver can operate simultaneously. In a number of lighting systems, however, it may be desirable to increase the number of LEDs used and/or power used by the LEDs, and thus supplied by the power supply, beyond that of Class 2. Thus, additional care may be taken in designing circuitry and installations for non-Class 2 lighting systems that are not Class 2 compliant.

Non-Class 2 lighting systems are discussed in more detail below. Non-Class 2 lighting systems may be suitable for indoor or outdoor applications. Such lighting systems may use LEDs and light-guide technologies for a variety of reasons such as reduced glare compared with conventional lighting as well as a pleasing appearance when the lighting system is in both an on state, in which one or more of the LEDs of the system provide illumination, and an off state, in which none of the LEDs provide illumination. LEDs with light-guide optics can be used with both indoor and outdoor applications.

As described above, Class 2 lighting systems can be relatively straightforward to design and manufacture due to the relatively low power. However, for relative high-power and/or high voltage (non-Class 2) lighting systems, additional safety-related factors may prove more challenging to meet in a design. Specifically, meeting standards related to electrical- and fire-safety issues can create challenges when designing and manufacturing a high-power LED light engine for a non-Class 2 system.

The information described in this section is provided to offer the skilled artisan a context for the following disclosed subject matter and should not be considered as admitted prior art.

DETAILED DESCRIPTION

Figure 1A:
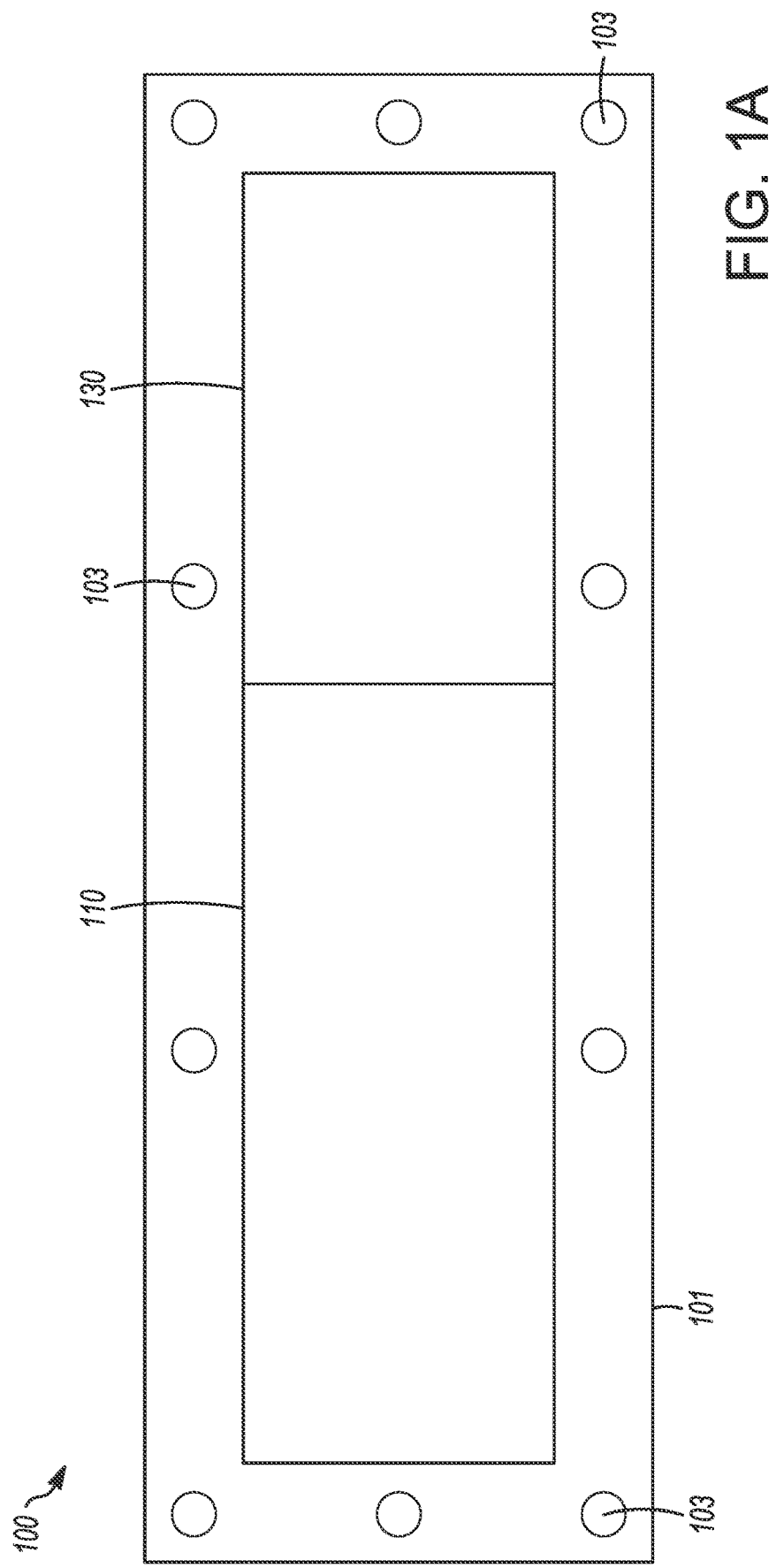
FIG. 1A shows a highly-generalized an exemplary plan view of a non-Class 2 LED module.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

Examples and related exemplary materials for forming LED-modules will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer generally to like elements throughout.

It will be understood that, although the terms first, second, third, etc. may be used herein to describe various elements. However, these elements should not be limited by these terms. These terms may be used to distinguish one element from another. For example, a first element may be termed a second element and a second element may be termed a first element without departing from the scope of the disclosed subject matter. As used herein, the term "and/or" may include any and all combinations of one or more of the associated listed items.

It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper," "lower," "horizontal," or "vertical" may be used herein to describe a relationship of one element, zone, or region relative to another element, zone, or region as illustrated in the figures. It will be understood that these terms are intended to encompass different orientations of the device in addition to an orientation depicted in the figures. Further, whether the LEDs. LED arrays, arrangements of layers within a domed LED, as well as related electrical components and/or electronic components are housed on one, two, or more electronics boards may also depend on design constraints and/or a specific application.

Semiconductor-based light-emitting devices or optical power-emitting-devices, such as devices that emit infrared (IR), visible (VIS), or ultraviolet (UV) optical power, are among the most efficient light sources currently available. These devices may include light emitting diodes, resonant-cavity light emitting diodes, vertical-cavity laser diodes, edge-emitting lasers, or the like (simply referred to herein as LEDs). Due to their compact size and low power requirements, LEDs may be attractive candidates for many different applications. For example, the LEDs may be used as light sources (e.g., flashlights and camera flashes) for hand-held battery-powered devices, such as cameras and cellular phones. LEDs may also be used, for example, for automotive lighting, heads-up display (HUD) lighting, horticultural lighting, street lighting, a torch for video, general illumination (e.g., home, shop, office and studio lighting, theater/stage lighting, and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where enhanced brightness is desired or required.

As noted briefly above, LED modules, in particular non-Class 2 modules, can have stringent safety regulations imposed by standards promulgated by, for example, Underwriters Laboratories (e.g., UL standards) driving their design. The LED modules may be combined with or without Driver-on-Board (DoB) electronic components. The DoB electronic components provide to power to drive and/or control the LEDs. Many or most of these LED modules generally include optical components, from multiple lenses to a single lens-plate. The optical components are typically formed from a transparent polymeric material, and often include an enclosure to pass the requirements related to electrical and fire safety. Additional requirements for wet locations of an LED module are not considered herein, since such wet-location requirement are usually considered at the luminaire level.

The disclosed subject matter described herein combines one or more lenses and a safety enclosure to reduce overall system cost. Resulting "optical enclosures" of the disclosed subject matter are arranged to comply with applicable UL standards requirements, in the context of LED modules, for either Class 2 or non-Class 2 systems.

Overall, the disclosed subject matter addresses electrical enclosure requirements and fire enclosure requirements for LED modules, and the related electrical and fire test. For example, with regard to electrical enclosure requirements. LED modules must be able to pass several tests to be in compliance with UL standards. Each of these tests is recognizable to a person of ordinary skill in the art.

One test is an impact test. The main passing criterion of the impact test is that, after a defined impact, there can be no accessibility to potentially-energized electrical components ("live parts"). The impact test is a mechanical-shock test that does not have an easily-predictable outcome. For example, 6 mm of a synthetic resin, polymethyl methacrylate (PMMA), may get cracked but not shattered following the mechanical-shock test. Consequently, for a directly-lighted LED module, with LEDs and live electrical components located directly below the secondary optic, various embodiments of the disclosed subject matter include adding reinforcing mechanical features under the LED lens to reduce or minimize the risk of cracking. However, as explained in more detail below, these mechanical features are spaced greater than 0.8 mm away from live parts that are mounted on a printed circuit board or other substrate.

Other electrical-enclosure requirements relate to parameters of various types of plastic materials. For example, the Relative Temperature Index (RTI) is a characteristic parameter related to the thermal degradation of plastic materials. RTI is the maximum service temperature for a material where a class of critical properties (defined within the guidelines) will not be unacceptably compromised through chemical or thermal degradation. Electrical RTI is associated with critical electrical insulating properties. The mold stress-test relates to the use of UL-recognized plastic materials with a minimum 70° C. RTI. UL further specifies an ultraviolet (UV)-resistance test. However, the UV-resistance test is applicable only to wet locations, which, as noted above, are usually considered at the luminaire level and are therefore inapplicable to LED modules.

Additionally, several tests used to evaluate a material's ability to resist ignition are hot-wire ignition (HWI), high-current (or high-amperage) arc ignition (HAI), and comparative tracking index (CTI). The HWI test determines the resistance of a polymeric material to ignition when exposed to abnormally high temperatures resulting from a component failure, such as a conductor carrying far more than its rated current capacity. The HAI test determines a material's ability to withstand electrical arcing either directly on or just above the surface of the plastic material. CTI is used to assess the relative resistance of insulating materials to tracking, which comprises an electrical breakdown on the surface of an insulating material.

With regard to fire enclosure requirements, another test relates to flammability as defined by compliance with the UL 5VA flame-retardant classification. According to partial requirements under classification 5VA, burning stops within 60 seconds on a vertical specimen and no drips of the material comprising the specimen are allowed. The 5VA classification applies for fixed or stationary units in general. However, the UL 94 Safety Standard flame-retardant classification V-0 applies if a secondary optic is used as an enclosure and live parts are greater than 0.8 mm away from the material used to form the optic. A partial requirement under the V-0 classification requires burning of a polycarbonate (PC) lens to stop within 10 seconds on a vertical specimen; drips of PC particles are allowed provided the particle drips are not inflamed. Further, the CTI, HWI, HAI requirements are waived (i.e., there is no requirement to comply with these requirements) if live parts are greater than 0.8 mm from the material used to form the optic.

Alternatively, if a fire barrier rated by the 5VA classification is positioned between the circuit that represents a risk of fire and the secondary optic, the secondary optic needs only to be evaluated as an electrical enclosure (described above). Usually this situation is possible for LED modules without a DoB but unlikely otherwise.

Therefore, based on various UL requirements described above, the following guidelines for LED modules and polymeric-material-based enclosure designs should be considered:

For Class 2 modules (isolated from AC mains and having a total power of less than 100 W and an operating voltage of less than 60 VDC), there are no requirements on the lens but a minimum polymeric material RTI (and a maximum operating temperature (MOT) that is compatible with operating temperatures for an end application may apply.

For Non-Class 2 modules (not isolated from AC mains or having a total power greater than 100 W or an operating voltage greater than 60 VDC), and either with or without a DoB:
 a. An optical-enclosure part place over a DoB region must pass electrical and fire enclosure requirements noted herein (e.g., flammability requirement according to a 5VA classification). For most PC plastics available having a UL-recognition, this requirement would imply a minimum of a 3 mm thickness in the DoB region. Further, if a greater than 0.8 mm spacing can be met from the PC plastic material to live parts, the CTI, HWI, and HAI requirements are waived (i.e., there is no requirement to comply with these requirements). A sidewall around the DoB region, as defined herein, can be included to provide mechanical reinforcement and prevent accessibility from the sides of the enclosure in case the rest of the optical enclosure is broken after, for example, an impact test.

b. An optical-enclosure part over an LED-containing region (e.g., a secondary optic part) must pass electrical and fire enclosure requirements noted above but with secondary optic exceptions allowed (e.g., V-0 classifications can be ignored if there is greater than a 0.8 mm spacing from the secondary optic to live parts). For most PC plastics available with UL-recognition, this requirement would also imply a minimum of a 1.5 mm thickness of the plastic used to form the secondary optic in that region.

c. If the DoB produces a Class 2 output, then there should not be additional requirements to the optical enclosure part over the LED region of the module. Further, this situation eliminates the need to pass an impact test in that region.

Consequently, as shown and discussed in more detail below, all electrical- and fire-related safety requirements have been considered to produce resulting exemplary design rules related to geometrical spacing of components and ranges of thicknesses for the optical enclosure to be applied to meet the safety requirements. The inventors have identified several optical materials (PC for example) as meeting the requirements with acceptable thicknesses and, therefore, be designed for such modules.

Other embodiments could include softer materials to meet more easily mechanical stresses. One such material is, for example, substantially-clear silicone. Additionally, multi-material injection-molding or extrusion processes with one or more different grades of plastic may be considered for the electronics components part of the enclosure, instead of single-material injection molding, as to reduce the thickness of the polymeric material in that region and further reduce total costs. In various embodiments, an overall shape of the components discussed is flexible and is not considered to be a limiting factor in the disclosed subject matter.

With reference now to FIG. 1A, a highly-generalized exemplary plan-view of a non-Class 2 LED module 100 is shown. The non-Class 2 LED module 100 is described in more detail with reference to FIG. 1B, below. In an embodiment, the non-Class 2 LED module 100 comprises LEDs and DoB electronic components typically arranged in two main regions with two main sets of components. The two main sets of components include an LED lens portion 110 and a DoB portion 130 of the optical enclosure. As discussed below with reference to FIG. 1B, optical enclosures 115, 135 (see FIG. 1B) are contained within the LED lens portion 110 and a DoB portion 130, respectively. The optical enclosures 115, 135 may be attached to a printed-circuit board (PCB) 101 or other substrate by various means known in the art, such as by chemical adhesives or, in an exemplary embodiment, by a plurality of mechanical fasteners 103. LEDs and other electronic components within respective portions of the LED lens portion 110 and the DoB portion 130 may be bonded or otherwise mounted to the PCB 101. For example, the LEDs and other electronic components may be electrically coupled to the PCB 101 by techniques known in the art, such as by using surface-mount technologies (SMT), controlled collapse chip connection (C4), solder-bump mounting techniques, or other mounting techniques.

Consequently, and with continuing reference to FIG. 1A, a first region of the non-Class 2 LED module 100 is delimited by the electronic components comprising the DoB portion 130. The DoB portion 130 contains circuitry to convert AC electrical power into electrical power used to energize the LEDs. A second region of the non-Class 2 LED module 100 is delimited by the LED lens portion 110, which includes electrical traces on the PCB 101 used to conduct electrical power provided by the DoB portion 130 to energize the LEDs within the LED lens portion 110.

Figure 1B:
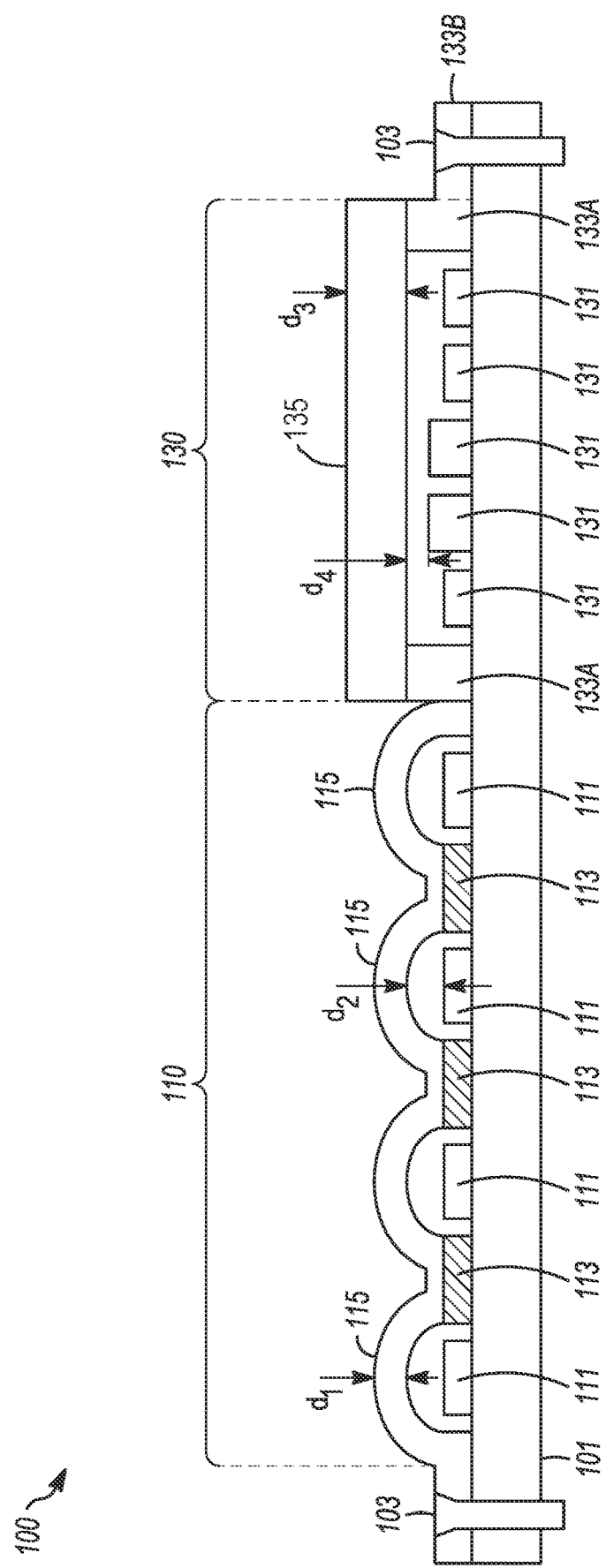
FIG. 1B shows an exemplary cross-sectional elevational view of the non-Class 2 LED module of FIG. 1A.

FIG. 1B shows an exemplary cross-sectional elevational view of the non-Class 2 LED module 100. In this exemplary embodiment, FIG. 1B includes the PCB 101 and a plurality of the mechanical fasteners 103. Within the LED lens portion 110 of the non-Class 2 LED module 100, FIG. 1B is further shown to include a plurality of LED elements 111 (e.g., LED dice), a plurality of mechanical pillars 113, and the optical enclosure 115. The plurality of mechanical pillars 113 pillars (which may simply be incorporated as an extension of the optical enclosure 115 as various points) provide a mechanical reinforcement to impacts (e.g., to an impact test).

In this embodiment, the optical enclosure 115 is formed as lenses over the LEDs. The person of ordinary skill in the art will understand that, since FIG. 1B is a two-dimensional drawing, there may be many "columns" of LEDs behind each of "rows" of the plurality of LED elements 111 shown. Depending upon a desired radiation-distribution pattern and/or focus of the LEDs, the optical enclosure 115 may be formed as a continuous cylindrical lens, or a plurality of spherical lenses (e.g., a convex-concave (meniscus) lens over each of the plurality of LED elements 111).

Within the DoB portion 130 of the non-Class 2 LED module 100, FIG. 1B is shown to include various electronic components 131 for the DoB, a sidewall-separation portion 133A with an optional extension portion 133B (which may be formed as a portion of the sidewall-separation portion 133A to aid in mounting components to the PCB 101 with the plurality of mechanical fasteners 103), and the optical enclosure 135. The sidewall-separation portion 133A surrounds the various electronic components 131 of the DoB and provides both mechanical reinforcement and provides for extra safety (e.g., to prevent accessibility to live parts after an impact test). Overall, in various embodiments, the optical enclosure may be considered to be comprised of components including the optical-enclosure 115, 135, the sidewall-separation portion 133A, and the optional extension portion 133B.

The optical enclosure 115 can be molded or otherwise formed to provide the functions of an optical lens. However, US Safety Standards dictate certain fire and electrical requirements as defined in more detail below. For example, in a specific exemplary embodiment, a thickness, $d_1$, of the optical enclosure 115 may be, for example, 1.5 mm for an optically clear polycarbonate (PC) lens, although any polymeric material may be used. (The skilled artisan will of course recognize that the optical enclosure 115 may comprise glass materials; however, a desired low-cost application of the disclosed subject matter may not be realized and the impact test may be more difficult to pass.) The 1.5 mm thickness allows a PC lens to comply with the UL 94 Safety Standard flame-retardant classification V-0, described above.

A distance, $d_2$, is greater than a 0.8 mm minimum distance to any live parts to comply with UL waivers related to certain UL testing procedures. Therefore, having the distance, $d_2$, greater than a 0.8 mm minimum distance to any energized electrical components ("live parts") eliminates a need to comply with UL requirements for HAI, HWI, and CTI.

With continuing reference to FIG. 1B, on the DoB portion 130 of the non-Class 2 LED module 100, a thickness, d %, of the optical enclosure 135 may have a minimum thickness of, for example, 3 mm for an optically clear PC for UL 5VA flame-retardant classification compliance. According to classification 5VA, burning stops within 60 seconds on a vertical specimen; no drips allowed. A distance, $d_4$, of greater than 0.8 mm allows for waivers to HAI, HWI, and CTI UL requirements.

The description above includes illustrative examples, devices, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations. Further, the term "about," as used herein, may be considered to be within a range of 10% in particular embodiments. In other embodiments, the term "about" may be considered to be within a range of 20%.

Although various embodiments are discussed separately, these separate embodiments are not intended to be considered as independent techniques, designs, or processing methods. As indicated above, each of the various portions may be inter-related and each may be used separately or in combination. Consequently, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A combined lens and safety enclosure apparatus for a light-emitting diode (LED) module, the enclosure apparatus comprising:
   at least one plastic-material-based optical-lens element mounted over a plurality of LED elements, a distance between the optical-lens element and any portion of any one of the plurality of LED elements being spaced away from each other by at least 0.8 mm;
   a driver-on-board (DoB) subsystem; the DoB subsystem including an electronic circuit configured to provide power to the plurality of LED elements;
   a plastic-material-based optical enclosure mounted over the DoB subsystem, a distance between the plastic-material-based optical enclosure and any portion of any of the electronic circuit being spaced away from the plastic-material-based optical enclosure by at least 0.8 mm; and
   a sidewall-separation portion surrounding the DoB subsystem and below the plastic-material-based optical enclosure, the sidewall-separation portion to provide mechanical reinforcement and prevent accessibility from side portions of the LED module.

2. The enclosure apparatus of claim 1, wherein the plastic material comprises a polycarbonate.

3. The enclosure apparatus of claim 2, wherein a thickness of the polycarbonate mounted over the plurality of LED elements is greater than 1.5 mm.

4. The enclosure apparatus of claim 1, wherein the plastic material comprises substantially-clear silicone.

5. The enclosure apparatus of claim 1, wherein the plastic material comprises one or more different grades of plastic.

6. The enclosure apparatus of claim 1, further comprising a plurality of mechanical pillars formed around at least some of the plurality of LED elements.

7. The enclosure apparatus of claim 1, wherein a thickness of the optical-lens element mounted over the plurality of LED elements is at least 1.5 mm.

8. The enclosure apparatus of claim 1, wherein a thickness of the optical enclosure mounted over the DoB subsystem is at least 3 mm.

9. A combined lens and safety enclosure apparatus for a light-emitting diode (LED) module, the enclosure apparatus comprising:
   at least one plastic-material-based optical-lens element mounted over a plurality of LED elements, a distance between the optical-lens element and any portion of any one of the plurality of LED elements being spaced away from each other by at least 0.8 mm, the at least one plastic-material-based optical-lens element comprising a polycarbonate being at least 1.5 mm in thickness;
   a plurality of mechanical pillars formed around at least some of the plurality of LED elements;
   a driver-on-board (DoB) subsystem; the DoB subsystem including an electronic circuit configured to provide power to the plurality of LED elements; and
   a plastic-material-based optical enclosure mounted over the DoB subsystem, a distance between the optical enclosure and any portion of any of the electronic circuit being spaced away from the plastic-material-based optical enclosure by at least 0.8 mm, the plastic-material-based optical enclosure comprising a polycarbonate being at least 3 mm in thickness.

10. A combined lens and safety enclosure apparatus for a light-emitting diode (LED) module, the enclosure apparatus comprising:

at least one plastic-material-based optical-lens element mounted over a plurality of LED elements, a distance between the optical-lens element and any portion of any one of the plurality of LED elements being spaced away from each other by at least 0.8 mm;

an electronic circuit configured to provide power to the plurality of LED elements;

a plastic-material-based optical enclosure mounted over the electronic circuit; and a sidewall-separation portion surrounding the electronic circuit and below the plastic-material-based optical enclosure, the sidewall-separation portion to provide mechanical reinforcement and prevent accessibility from side portions of the LED module.

11. A combined lens and safety enclosure apparatus for a light-emitting diode (LED) module, the enclosure apparatus comprising:

at least one plastic-material-based optical-lens element mounted over a plurality of LED elements;

a driver-on-board (DoB) subsystem;

the DoB subsystem including an electronic circuit configured to provide power to the plurality of LED elements;

comprising a plurality of mechanical pillars formed around at least some of the plurality of LED elements; and a plastic-material-based optical enclosure mounted over the DoB subsystem, a distance between the plastic-material-based optical enclosure and any portion of any of the electronic circuit being spaced away from the plastic-material-based optical enclosure by at least 0.8 mm.

* * * * *